United States Patent [19]
Velie

[11] Patent Number: 5,480,483
[45] Date of Patent: Jan. 2, 1996

[54] APPARATUS FOR DEPOSITING SOLDER ON THE TERMINAL PADS OF PRINTED CIRCUIT BOARDS

[75] Inventor: Larry N. Velie, El Toro, Calif.

[73] Assignee: Velie Circuits, Inc., Costa Mesa, Calif.

[21] Appl. No.: 98,847

[22] Filed: Jul. 29, 1993

Related U.S. Application Data

[62] Division of Ser. No. 851,912, Mar. 16, 1992, Pat. No. 5,246,731.

[51] Int. Cl.$^6$ ............................... H05K 3/34; B05C 5/04
[52] U.S. Cl. ........................... 118/45; 118/101; 118/106; 118/301; 118/316
[58] Field of Search ................................ 118/45, 50, 68, 118/69, 71, 101, 100, 106, 301, 315, 316

[56] References Cited

U.S. PATENT DOCUMENTS

| | | | |
|---|---|---|---|
| 4,127,692 | 11/1978 | Boynton | 427/96 |
| 4,493,857 | 1/1985 | Knigge | 427/96 |
| 4,539,069 | 9/1985 | Fishman et al. | 156/640 |
| 4,720,324 | 1/1988 | Hayward | 156/645 |
| 5,172,853 | 12/1992 | Maiwald | 228/248 |

FOREIGN PATENT DOCUMENTS 3810653  5/1988  Germany.

*Primary Examiner*—Jeffrey R. Snay
*Attorney, Agent, or Firm*—Harold L. Jackson

[57] ABSTRACT

An apparatus for depositing solder on the terminal pads of printed circuit boards in which a solder resist layer or layers having a thickness corresponding to the desired solder height border the pads. Molten solder from a reservoir is directed by nozzles against the sides of the board to fill the cavities extending above the terminal pads while the board is moving via a conveyor mechanism relative to the reservoir. The cavities when filled with molten solder are covered by a suitable element such as a flexible belt or roller. The molten solder within the covered cavities is then cooled below its solidification point and the covering element removed. If desired, part or all of the solder resist layer or layers may then be stripped from the board to leave solder pads extending above the surface of the board.

47 Claims, 5 Drawing Sheets

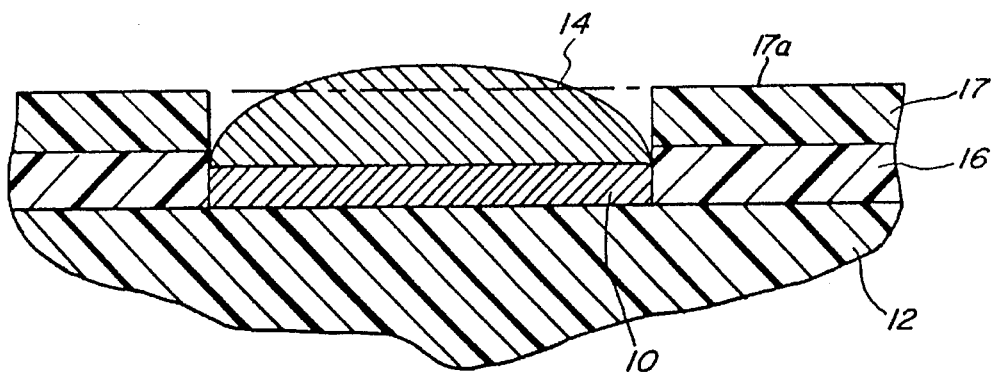
FIG. 1
PRIOR ART
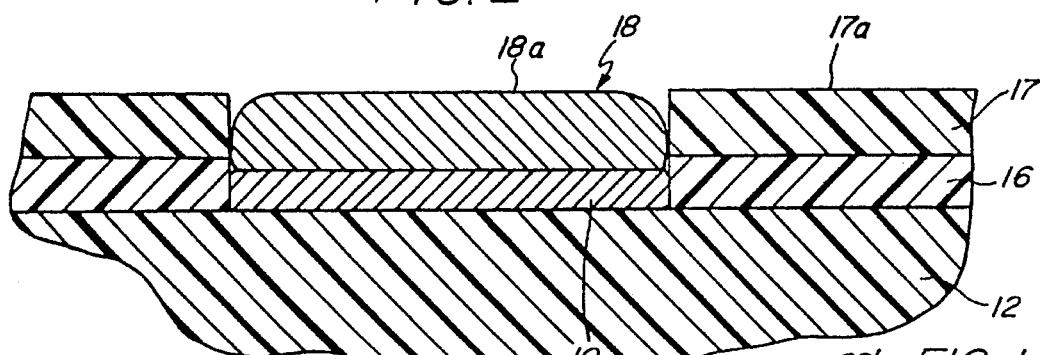
FIG. 2
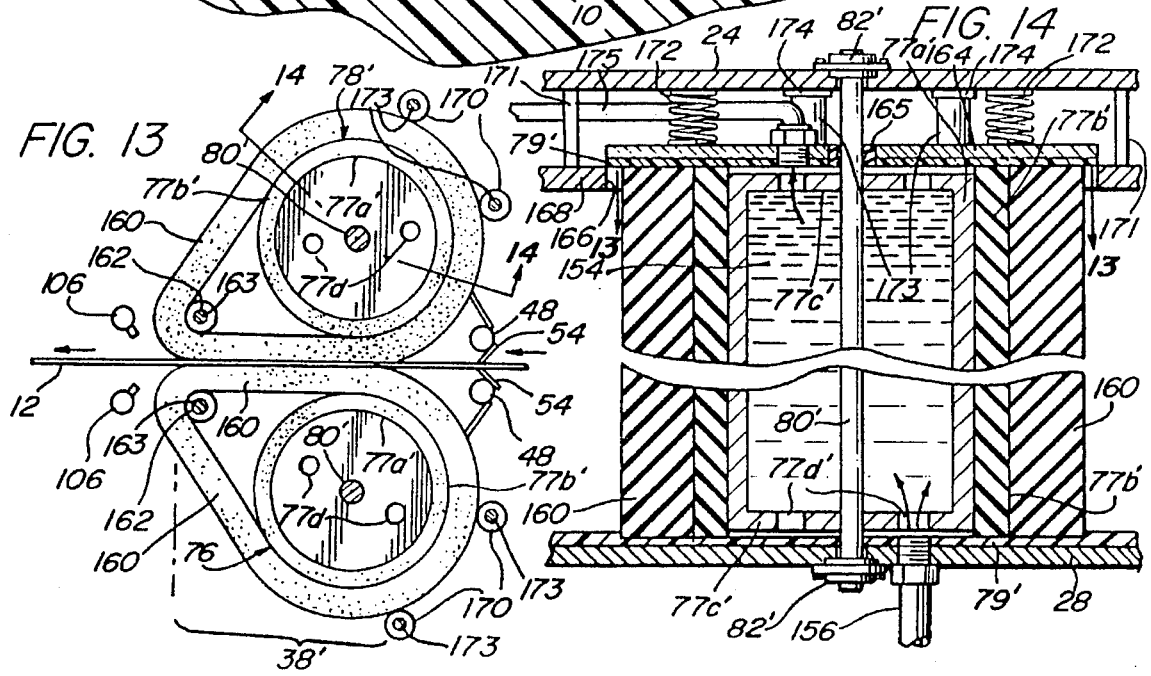

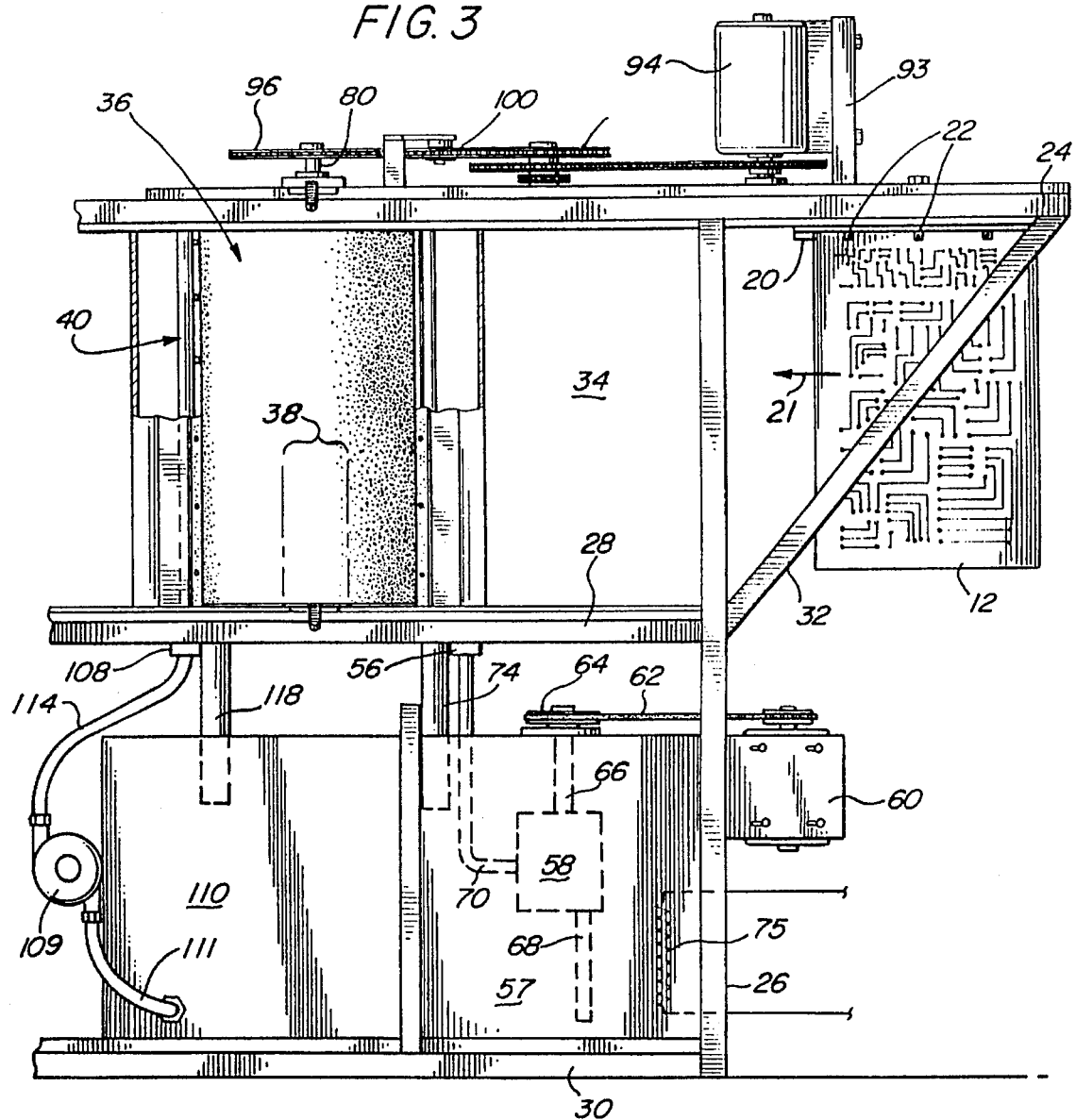
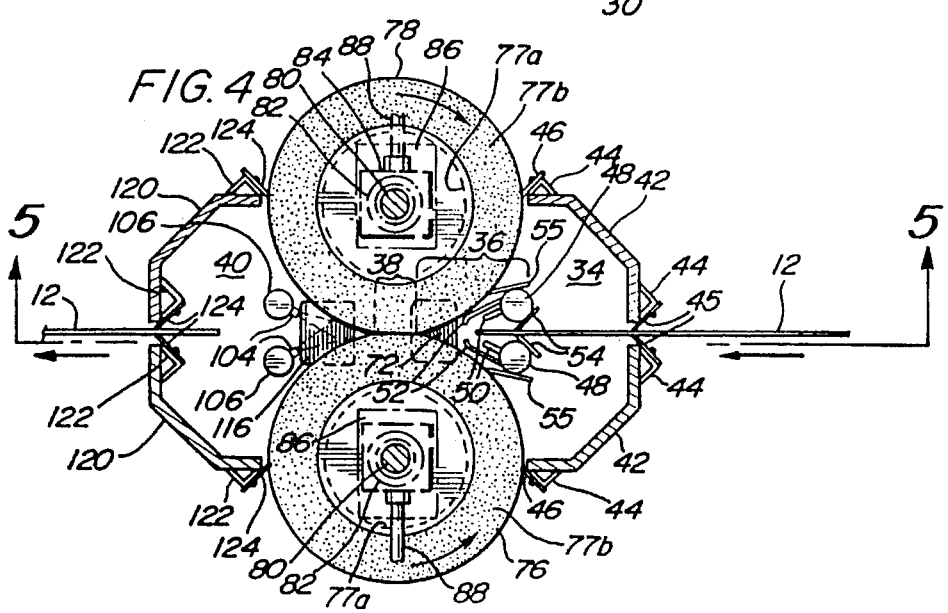

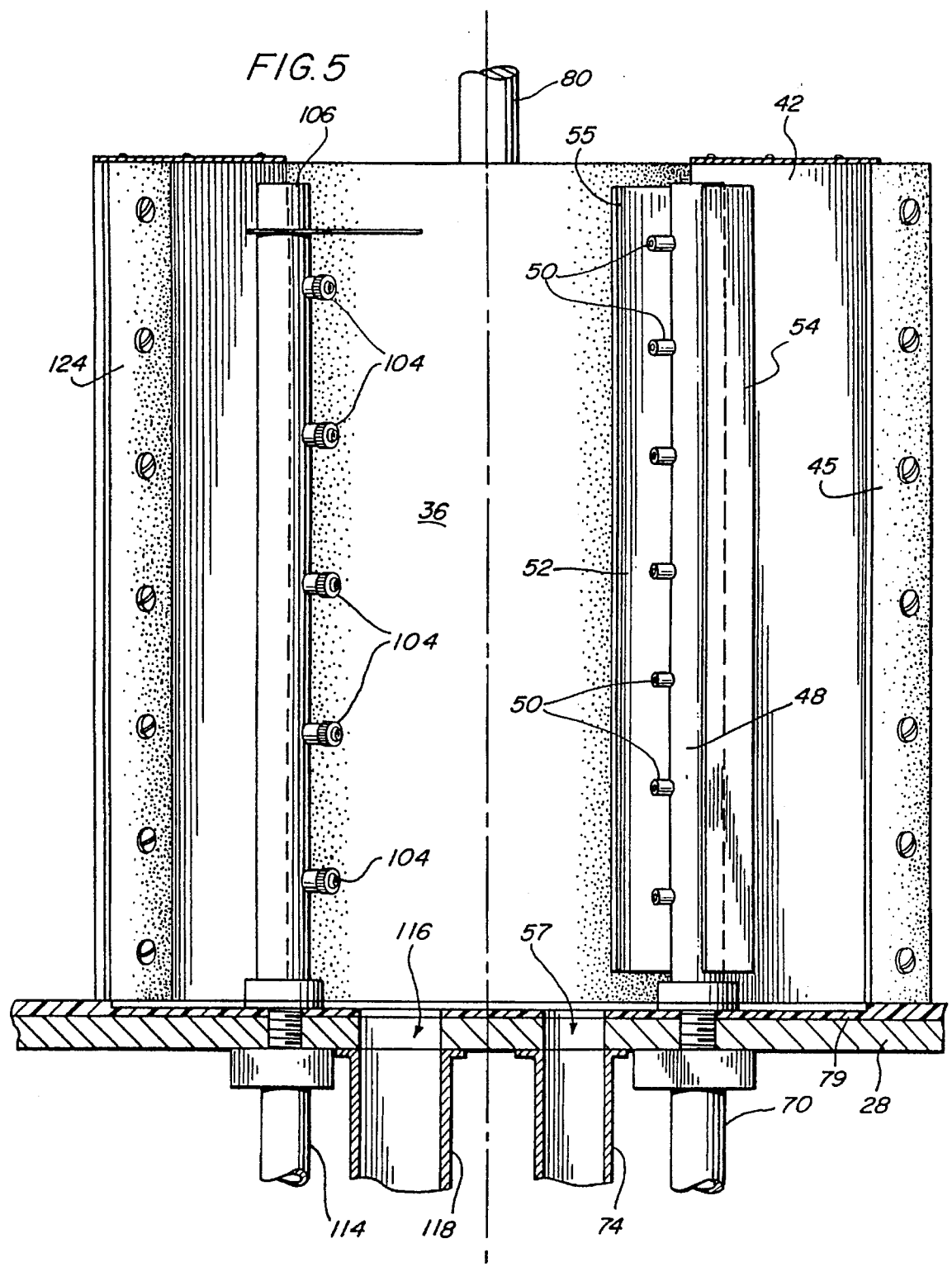

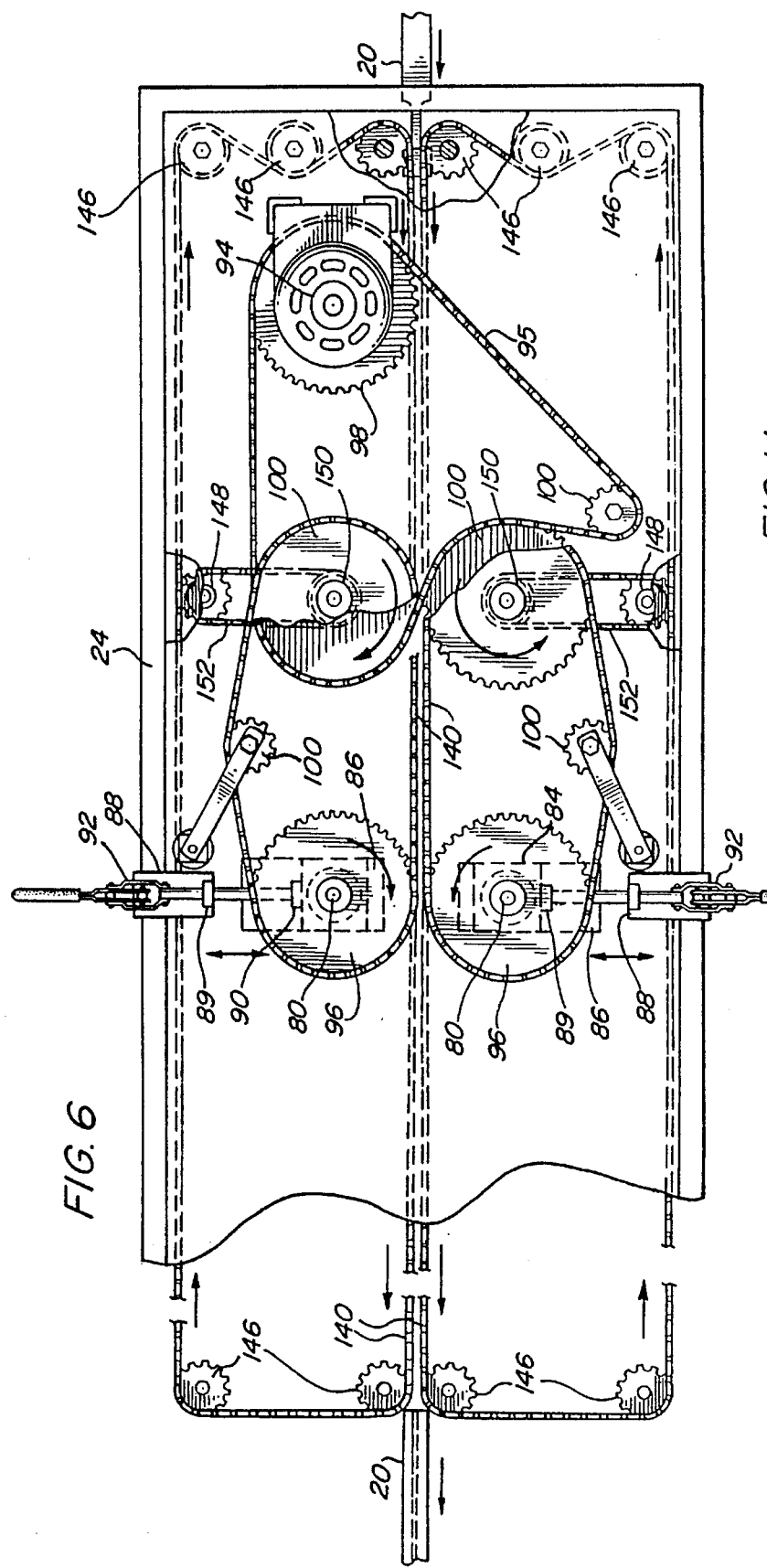
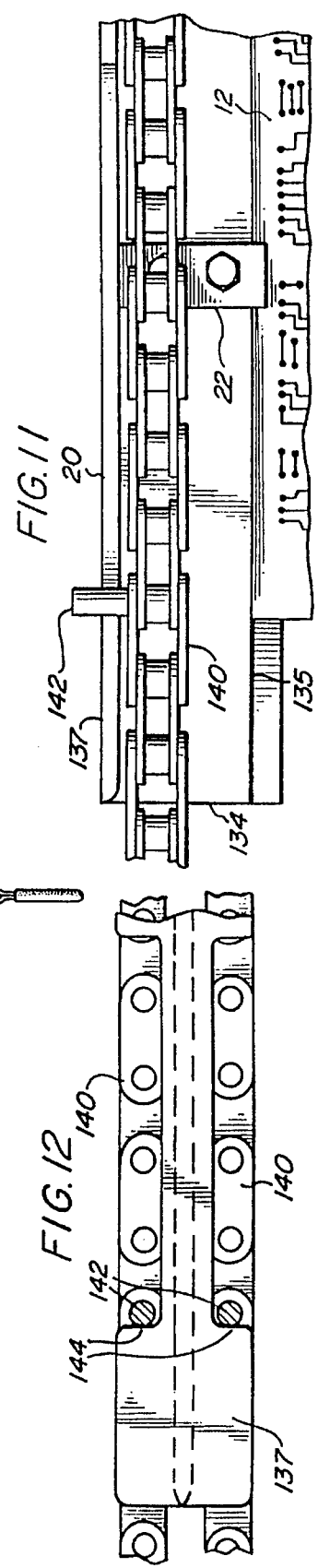

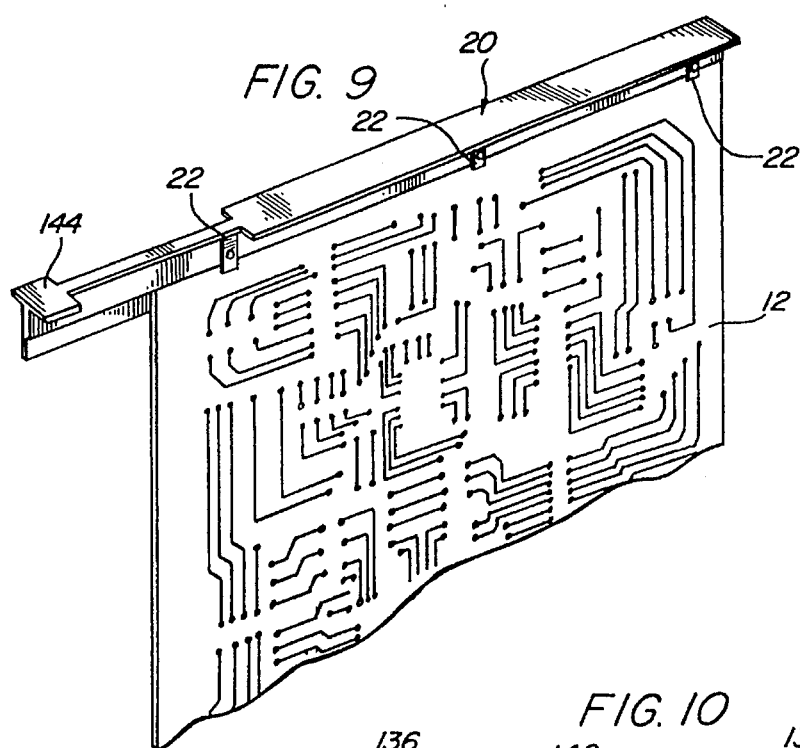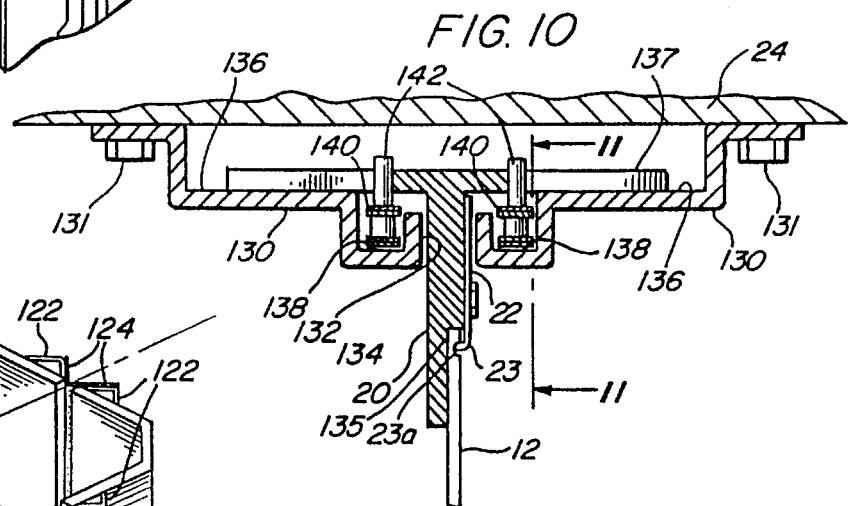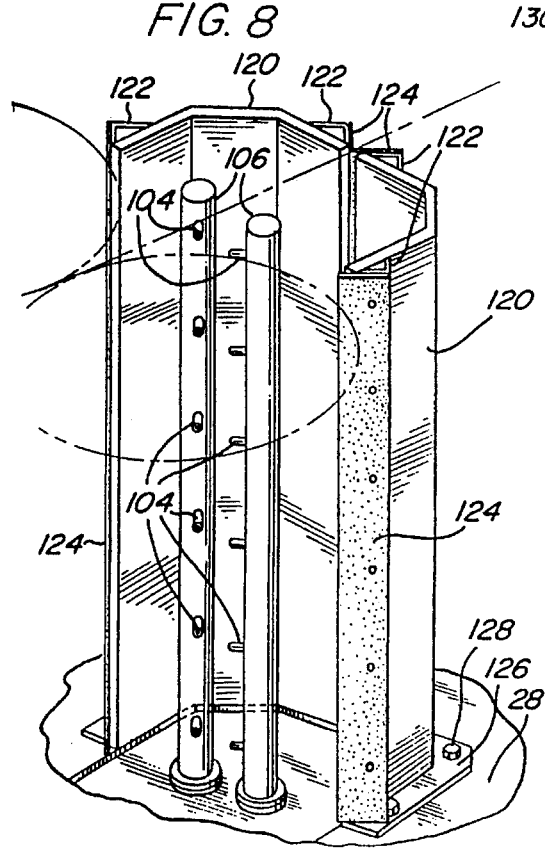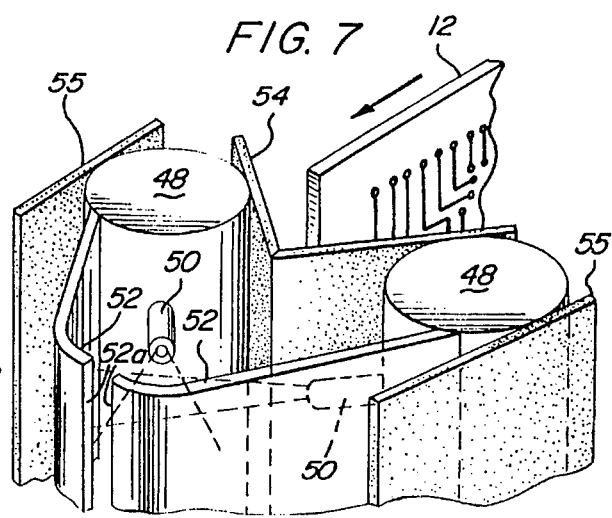

APPARATUS FOR DEPOSITING SOLDER ON THE TERMINAL PADS OF PRINTED CIRCUIT BOARDS

RELATED APPLICATION

This application is a division of application Ser. No. 851,912 filed Mar. 16, 1992 for Method and Apparatus for Depositing Solder on the Terminal Pads of Printed Circuit Boards, now U.S. Pat. No. 5,246,731.

BACKGROUND OF THE INVENTION

1. Field of the Invention

The present invention relates to printed circuit boards and more particularly to an apparatus for applying solder to the contact points or terminal pads on a circuit board which are to be electrically and mechanically connected to circuit components.

2. Description of the Prior Art

The electronics industry has become increasingly dependent on printed circuits for the interconnection of electronic components. Initially the electronic components were secured to the boards via leads which extended through holes in the boards. Today many components such as integrated circuits ("ICs") are mounted directly to the surface of the boards, i.e. by soldering the leads directly to terminal pads on the boards.

Technological improvements in integrated circuits have resulted in increased terminal lead densities with the attendant requirement of increased terminal pad densities on the printed circuit boards. The distance between the leads (i.e. pitch) of integrated circuits of the order of 0.015 inches (i.e, 15 mils) are not uncommon. Such a density requires that the spacing between the edges of the circuit board terminal pads be of the order of 7.5 mils.

To accommodate surface mounted components, such as ICs, on circuit boards, it is necessary to accurately apply solderable material such as a tin/lead alloy ("solder") or a solder containing paste to the circuit board terminal pads prior to the mounting operation. Once the solder or solder paste has been applied to the terminal pads, the surface mounted components can then be secured on the board by a suitable adhesive or the paste itself with the leads in contact with the terminal pads. The assembly is then heated by means of an oven heat lamp etc. to a temperature sufficient to melt the solder to form a electrical and mechanical bond between the terminal pads and the component leads.

One method commonly used to apply solder to the terminal pads of printed circuit boards is called dip soldering. In accordance with this method, the circuit board is dipped into a bath of molten solder and removed so that the metalized areas of the board not provided (e.g. terminal pads) receive a layer of solder. However, due to the solder's surface tension, the resulting layer is generally dome shaped as is illustrated in FIG. 1 of the drawings. Streams of hot air may be used to remove some of the excess solder. However, the depth of the solder on the terminal pads will vary. When surface mounted components, such as IC's with high density lead terminals are mounted on the board and the solder heated, some of the lead terminals may not be wetted by the molten solder because of the uneven height of the solder on the pads. While the open circuits resulting from the insufficient depth of solder may be correctable, the time and cost of finding and remedying the open circuits is significant.

Another method commonly used to apply solder to terminal pads involves the use of a solder paste which is deposited on the terminal pads by silk screening or mask printing techniques. The surface mounted components are then placed on the board so that their lead terminals are embedded in the paste on the terminal pads. The components are held in place by the surface tension of the paste. The assembly is then heated to melt the solder and evaporate the volatile components and solvents of the paste. The paste, however, is expensive and difficult to apply. In addition, the paste may not accurately follow the contours of the pads resulting in an unacceptable finished product.

More recently two additional methods of applying solder to the terminals pads of printed circuit boards have been disclosed in the prior art, German Patent No. DE 3,810,653 which issued to Dieter & Gretta Friedrich on May 18, 1988, teaches a method for depositing solder on the terminal pads on one side of a circuit board in which a sacrificial solder resist mask is used to border the terminal pads and define the height of the solder. In accordance with the Friedrich patent, the board with the sacrificial mask in place is dipped into a bath of molten solder and a flat covering device, such as a plate, is then clamped against the board to hold the solder in place and within the cavities on the board formed by the boarding mask and the terminal pads. The board and covering device are lifted as a unit from the solder bath and as soon as the solder solidifies, the covering device is removed. The sacrificial mask is then stripped from the board leaving a layer of solder on each of the terminal pads. While this method may deposit a uniform layer of solder on the pads it is limited to relatively small circuit boards and not amenable to mass production.

U.S. Pat. No. 4,720,324, which issued to John S. Hayward on Jan. 19, 1988, discloses a method in which a layer of a tin/lead alloy is electroplated onto the terminal pad areas and subsequently heated and amalgamated into solder in the presence of flux to wet the leads of the surface mounted components. The '324 process requires several complex electroplating, stripping and etching steps which would add considerably to the cost of the resulting assembly.

There is a need for a simple and reliable apparatus for applying a uniform layer of solder to the conductive terminal pads of printed circuit boards which is amenable to mass production techniques.

SUMMARY OF THE INVENTION

A printed circuit board having terminal pads on at least one side thereof is provided with one or more solder resist layers covering the side except for the terminal pads. The solder resist layer or layers have a thickness corresponding to the desired height of the solder to be applied and form cavities above the terminal pads. A reservoir of molten solder is provided and a stream of molten solder from the reservoir is directed against the side or sides of the board containing the terminal pads while the board is positioned outside of the reservoir. The cavities, when filled with molten solder, are covered to force the solder against the terminal pads and within the cavities. The molten solder within the covered cavities is then cooled below its solidification point and the covering removed.

Preferably a conveyor mechanism is used to hold the board in a vertical plane and move the board along a horizontal axis past the solder reservoir. A pump and one or more nozzles are used to direct solder from the reservoir against the side of the board along a first vertically oriented zone commencing at the front and ending at the rear of the board. The cavities may be covered by means such as a belt or roller which is compressed against the side or sides of the board along a second vertically oriented zone located adjacent the first zone. The solder within the covered cavities may be cooled, for example, by maintaining the surface temperature of the roller or belt below the solidification temperature of the solder. As the board emerges from the covering belt or roller, the solidified solder extends from the terminal pads to an upper surface which is substantially flat and coplanar with the top surface of the solder resist layer or layers.

Where a sacrificial solder resist layer has been used, it may be removed to leave the circuit board with exposed solder pads suitable for electrically and mechanically bonding the leads of surface mount components such as ICs to the board.

The features of the present invention can best be understood by reference to the following description taken in conjunction with the accompanying drawings wherein like numerals designate like components.

BRIEF DESCRIPTION OF THE DRAWINGS

FIG. 1 is a cross-sectional view of a portion of a printed circuit board showing a terminal pad with solder deposited thereon in accordance with the prior art conventional dip soldering process;

FIG. 2 is a cross-sectional view of a portion of a printed circuit board showing a terminal pad with solder deposited thereon in accordance with the method and apparatus of the present invention;

FIG. 3 is a side elevational view of an apparatus for depositing solder on the terminals pads of printed circuit boards in accordance with the present invention;

FIG. 4 is a schematic top plan view showing the molten solder nozzle, cooling oil nozzle arrangement and covering rollers of the apparatus of FIG. 3 with the top plate removed and the bearing blocks for the rollers shown in phantom for clarity;

FIG. 5 is cross-sectional view along lines 5—5 of FIG. 4;

FIG. 6 is a top plan view partially broken away of the apparatus of FIG. 3;

FIG. 7 is a partial perspective view of the molten solder nozzle arrangement;

FIG. 8 is a perspective view of the cooling oil nozzle arrangement;

FIG. 9 is a perspective view of the conveyor carrier for holding the circuit board;

FIG. 10 is a cross-sectional view of the circuit board carrier and conveyor chain for moving the board through the solder application and solidification stations;

FIG. 11 is a side-elevational view of a segment of the conveyor chain and conveyor carrier; and FIG. 12 is a top plan view of a section of the conveyor chain;

FIG. 13 is a cross-sectional view along lines 13—13 of FIG. 14 of another embodiment of a roller/belt arrangement for providing a covering station of increased length over that shown in FIG. 4; and FIG. 14 is a cross-sectional view of the roller belt arrangement of FIG. 13 taken along lines 14—14.

DESCRIPTION OF THE PREFERRED EMBODIMENTS

Referring now to the drawings and particularly to FIG. 1, a terminal (or surface mount) pad 10 on a section of a printed circuit board 12 is illustrated with solder 14 deposited thereon in accordance with the prior art dip soldering process. A conventional permanent solder resist layer 16 for protecting the traces overlays the surface of the board except for the metalized areas such as the terminal pads which are to receive the solder. A temporary solder resist layer 17 overlaps the permanent layer 16. As discussed previously the solder 14, due to surface tension, assumes a dome shape. The height of the dome will vary among terminals having different as well as the same dimensions.

FIG. 2 illustrates a pad of solder 18 on terminal pad 10 which has been processed in accordance with my invention. The solder pad 18 has a flat upper surface 18a which is coplanar with the exposed surface 17a of solder resist layer 17 which extends over the permanent or primary solder resist layer mask 16. The combined thickness of the solder resist layers 16 and 17 determines the height of the solder pads 18.

To apply solder to the terminal pads of a circuit board in accordance with my invention, it is first necessary to apply one or more solder resist layers, such as 16 and 17, to the side or sides of the circuit board which contains the terminal pads. The solder resist layer(s) cover the side or sides of the circuit board except for the areas of the terminal pads (or contact points) to receive the solder. The solder resist layer (s) border the terminal pads and define cavities extending above (or outwardly from) the pads as shown. The thickness of the layer(s) determines the height of the resulting solder as discussed. Typically the primary or permanent solder resist layer 16 has a thickness of the order of 0.001 to 0.003 inches. Solder layer thickness of this magnitude may be sufficient for circuit boards having very small and closely spaced terminal pads. Where a thicker layer of solder is desired a temporary or sacrificial solder resist layer or mask 17 may be used. For example, a photosensitive solder resist sacrificial mask having thicknesses of the order of 0.003 to 0.005 inches may be placed over the entire surface of the side or sides of the board containing the terminal pads. The areas to be soldered i.e. terminal pads, may be exposed to light in a conventional manner. After exposure the circuit board may be placed in a bath that washes away the exposed areas. A suitable sacrificial mask is distributed by DuPont Corporation under the Trademark designation OPTIMASK. After the solder deposition process has been completed, as will be described hereinafter, the sacrificial mask may be removed if desired by conventional techniques.

Referring now to FIGS. 3–9 and particularly to FIGS. 3 and 4 there is illustrated an apparatus for applying solder to the conductive terminal pads of the circuit board 12 of FIG. 2. The circuit board 12 may be formed of a suitable multiple layer insulation material with internal conductors and component surface mount or terminal pads 10 on one or both sides of the board. Typically the board may have four layers with a resulting thickness of about 0.062 inches and terminal pads on each surface.

The circuit board 12 is secured along its top edge to a T-shaped conveyor carrier 20 via hooks 22 as will be described in more detail in conjunction with FIGS. 9 and 10.

The conveyor is mounted to the top plate 24 of a frame including four vertical corner posts 26 (only one of which is shown), an intermediate plate 28, a base 30 and a pair of angle braces 32. The board 12 is oriented in a predetermined plane, i.e., vertical, and is moved by the carrier 20 at a predetermined speed, e.g. of the order of 10–12 feet/min., from right to left (along a predetermined axis, i.e., horizontal, as indicated by the arrow 21) through a solder isolation chamber 34, a molten solder application chamber 36, a cover application station 38 and a cooling oil application chamber 40. Each of the chambers and the cover application station extend between the plates 24 and 28 so that molten solder and cooling oil is confined within the respective chambers.

The solder isolation chamber is formed by a pair of symmetrically arranged 90° elbow fences 42, angle brackets 44, semi-resilient sealing strips 45 and 46 and a pair of covering rollers 76 and 78 (to be described in more detail). The fences 42 and angle brackets 44 may be conveniently made of a stainless steel and the sealing strips may be made of teflon or other suitable material.

The molten solder application station includes a pair of vertical solder conduits or hollow towers 48 and a plurality of nozzles 50 mounted on the conduits for projecting molten solder against the board. A solder directing plate 52 is also mounted on each solder tower 48 for directing the molten solder from the nozzles directly against the sides of the board to cause the solder to enter the cavities formed by the terminal pads and the bordering layer(s). Sealing strips 54 and 55, like the strips 46, may also be made of teflon, and are mounted on the sides of the towers. The towers are closed at the top and extend through the intermediate plate 28 to an inlet manifold 56.

A reservoir 57 of molten solder is carried on the base plate 30 below the solder application station 38. A liquid solder pump 58 is mounted within the reservoir and driven by an electric motor 60 via V-belt 62, pulley 64 and shaft 66. The pump 58 has an inlet conduit 68 extending downwardly into the reservoir and an outlet conduit 70 which is connected to the solder tower manifold 56 so that the molten solder is pumped into both towers and exits via the nozzles 50. The intermediate plate 28 includes a solder return opening 72 therein which communicates with a return pipe 74 for returning excess molten solder to the reservoir. See FIG. 5. An external electric heater 75 supplies heat to the solder within the reservoir.

After exiting the solder station 36 the board passes between a pair of resilient rollers 76 and 78 which form the cover application station 38. Each roller preferably includes inner cylindrical sleeves 77a and a resilient and preferably a compressible outer annular sleeve 77b made of a suitable material such as silicon rubber which is not wetted by the solder and can be forced against the sides of the board to hold the molten solder within the cavities until the solder solidification or eutectic point is reached. The rubber sleeves 77b preferably have a thickness of about 1 to 3 inches and most preferably about 2 inches. I have found that it is desirable to compress the rollers against sides of the board with a pressure of the order of 1 to 3 psi to provide a predetermined width or vertical zone of the board (e.g. of the order of several inches and preferably about 3–5 inches) which is sandwiched between the rollers. The upper and lower ends of the rollers 76 and 78 bear against teflon plates 79 which are secured to the upper surface of the intermediate plate 28 (FIG. 5) and to the lower surface of the top plate 24 (not shown in FIG. 5).

Shafts 80 are suitably secured to the steel sleeves 77a and are mounted in bearings 82. The bearings 82 are in turn mounted on blocks 84 which are slidably received in slots 86 formed in the top and intermediate plates 24 and 28. Adjustment rods 88 extend through bushings 89 mounted on the respective plates and are threadedly received in adjustment nuts 90 mounted on the adjustment blocks. See FIG. 6.

The other end of the rods 88 are connected to an intermediate point on the levers 91 via linkage 92. The distal ends of the levers 91 are pivotally mounted to the respective plate so that when the levers are moved to the vertical position, the rollers are moved toward each other and when moved to the horizontal position, as shown in FIG. 5, the rollers are moved away from each other.

Rotation of the adjustment nuts 90 increases or decreases the travel of the rollers toward and away from each other and thus determines the compressive force applied by the rollers to the circuit board.

A common electric motor 94 mounted to the top plate 24 via a bracket 93 is used to rotate the rollers 76 and 78 in synchronism with a conveyor (to be described) which moves the circuit board. A chain 95 engages sprockets 96 mounted the roller shafts 80 via motor drive sprocket 98 and idler sprockets 100 as is illustrated in FIG. 6.

Referring again to FIGS. 3 and 4, the circuit board 12, after emerging from the rollers or cover application zone 38, enters the cooling oil application chamber 40 in which oil having a temperature preferably within the range of about 175° F. to 225° F. (preferably about 175° F.) is sprayed on both sides of the board by nozzles 104 carried by oil conduits 106. The oil conduits 106 are closed at the top and extend through the intermediate plate 28 to a manifold 108. An oil pump 109 pumps oil at an appropriate rate from a reservoir or tank 110 via an inlet hose 111 and outlet hose 114 to the manifold 108. An oil return opening 116 is formed in the intermediate plate 28 for returning oil that has drained from the board back to the reservoir 110 via pipe 118.

A pair of symmetrically arranged 90° elbow fences 120, angle brackets 122, semi-resilient sealing strips 124 and the rollers 76 and 78 form the cooling oil application station. The elbow fences (like the fences 42) may be made of stainless steel and secured to the intermediate plate 28 via flanges 126 and bolts 128 as is illustrated in FIG. 8. The rubber sleeves 77b of the rollers 76 and 78 are compressed to a slight amount between the teflon plates 79 carried by the top and intermediate plates 24 and 28 to prevent solder or oil from migrating past the tops or bottoms of the rollers. By the same token, the sealing strips 45, 46, 54, 55 and 124 extend between the teflon plates 79 to confine solder and oil to their respective chambers.

The conveyor carrier and conveyor mechanism for moving the circuit board through the solder application and covering stations will now be described in conjunction with FIGS. 6 and 9–11.

Referring specifically to FIG. 10, a pair of opposed flanges 130 are mounted on the upper plate 24 by suitable means such as bolts 131 and extend around the entire periphery of the plate. See FIG. 6. Slot 132 between the inner ends of the flanges 130 accommodate the downwardly depending central section 134 of the carrier 20. The flanges 130 also provide a horizontal support surface 136 on which the lower surface of the top plate 137 of the carrier 20 rests. The flanges 130 also define a pair of U-shaped channels 138 disposed on each side of the slot 132 for supporting a pair of closed loop conveyor chains 140. Carrier engagement pins 142 extend upwardly at spaced points from the conveyor chains and engage horizontally extending shoulder 144 formed in the top plate of the conveyor carrier so that a carrier and the associated circuit board attached thereto are moved by the conveyor chains from left to right as is illustrated in FIGS. 3, 4 and 6. The conveyor chains 140 engage guide sprockets 146 and drive sprockets 148. The drive sprockets 148 are in turn driven by the chain 95 via sprockets 150 and auxiliary chains 152 so that the speed of the conveyor carrier matches the linear speed of the surface of the covering rollers 76 and 78.

The hooks 22 of the conveyor carrier are preferably spring biased against one side of the circuit board and include terminal tips 23 (FIG. 10) which extend into depressions 23a within the board. The top of the board 12 rests against a shoulder 135 in the central section 134 as shown. The board 12 may be inserted and removed from the carrier manually or by an appropriate automated mechanism.

Prior to placing the apparatus in operation, the solder within the reservoir 57 is heated by an appropriate heater 75 until the solder is in a molten state. I have found that it is desirable to heat the solder to a temperature of about 430° to 440° F., although a lower or higher temperature may be desirable depending upon the dimensions of the apparatus and other parameters. Solder, a tin/lead alloy, is typically in a solid state at about 361° F. A 40% tin/60% lead alloy is in its molten state above about 371° F. and in its completely solid state below about 361° F. A higher tin content changes the melting temperature somewhat and the temperature range where the alloy is partly solidified and partly liquid as is well known in the art.

The oil in the reservoir may also be heated, if desired, to an appropriate temperature for contact with the board as it emerges from the covering element station. I have found that an oil temperature within the range of about 160° F. to 200° F. and preferably at about 175° F. provides good results in cooling the solidified solder on the terminal pads and the rollers 76 and 78. The oil spray from the nozzles 104 after striking the board is cooled by contact with the air. Additional cooling, for example, by running water through conventional heat exchangers located in the reservoir, may be employed if desired. Cooling oil may also be conducted through the inner sleeve 77a of each roller as is illustrated in connection with another embodiment depicted in FIGS. 13 and 14.

After the solder and oil are at the appropriate temperatures, the motor 94 and pumps 58 and 109 may be turned on. The circuit board 12, on which one or more layers of a solder resist layer have been applied to form a border for the terminal pads (which are to receive solder), is then snapped into the carrier 20. The board progresses from the front of the apparatus through the liquid solder sealing strips 45 into the isolation chamber 34 and then past the sealing strips 54 before entering the solder application station 36. The sealing strips 45 and 54, which slide along the surface of the board and the sealing strips 46 which engage the circumference of the rollers, substantially prevent liquid solder from migrating outside of the solder application and isolation chambers.

The solder nozzles 50 direct molten solder against both sides of the board 12 along a vertically oriented zone as illustrated. The solder directing plates 52 are curved so that their terminal ends 52a lie in a plane about perpendicular to the plane of the board as illustrated in FIGS. 4 and 7. The terminal ends 52a are disposed closely adjacent the sides of the board 12 (e.g. within about 0.010 inches from the board) and force molten solder from the nozzles directly into the cavities extending above the terminal pads.

The terminal pad cavities, which have been filled with solder at the solder application station, are immediately covered by the compressible rubber sleeves 77b of the rotating rollers 76 and 78. During the travel between the rollers (e.g. 2–5 inches in length) the solder within the cavities is cooled by the rollers to a temperature at or below its solidification point e.g. about 361° F.

The solidified solder within the cavities emerging from the rollers is then subjected to a cooling oil spray from the nozzles 104 to further cool the solder. The board then exits the oil cooling chamber 40 through sealing strips 124 and may be manually or automatically removed from the carrier 20 at the rear of the apparatus. While only one circuit board 12 is shown in FIG. 3 it is to be understood that the apparatus will accommodate a series of boards on a production line basis.

Referring now to FIG. 13, I have found that improved results can be obtained by increasing the width of the cover application station, identified as 38' to a width within the range of about 8–12 inches and preferably about 10 inches. In this embodiment rollers 76' and 78' are provided with an outer sleeve of rubber 77b' which is of the order of 1 to 2 inches in thickness and preferably about 1½ inches. A band or belt 160 of flexible and preferably compressible material such as silicon rubber extends around each of the rollers 76' and 78' and an idler roller 162 carried on shaft 163 which is rotatably mounted to the top and intermediate plates 24 and 28. Each belt 160 extends the length of the rollers and is compressed between the intermediate plate 28 and a floating plate 164 so that the belt is in sliding contact with the teflon plates 79'. The shafts 80' of the rollers 76' and 78' extend through seals 165 in the floating plate and are journaled in bearings 82' in the top and intermediate plates.

The floating plate 164 is positioned within an opening 166 in an auxiliary plate 168. The plate 168 is secured to the top plate 24 by suitable rods 171. The shafts compression springs 172 bias the floating plate 164 against the silicon rubber sleeves 77b and belts 160 to ensure the upper and lower edges of the belts (and the rubber sleeves 77b') are adequately compressed between the teflon plates 79' to prevent solder from migrating past the upper and lower edges of the belts. Idler rollers 170 carried on shafts 173 are rotatably mounted in the top and intermediate plates via bearings 174. The idler rollers force the belts 160 against the sides of the rollers 76' and 78' to prevent any substantial slippage between the belts and the rotating rollers.

The compression of the rubber belts 160 against the sides of the circuit board and between the teflon plates 79' firmly holds the molten solder within the terminal pad cavities and prevents the solder from migrating out of the cavities by the force of gravity. Preferably the belts 160 are forced against the sides of the circuit board with a pressure within the range of 3 to 5 psi.

The belts 160 are cooled by oil spray from the nozzles 106 so that their temperatures are preferably maintained within the range of about 230° F. to 250° F. and most preferably at about 240° F. Cooling oil may also be circulated through the inner sleeve 77a' of each roller via a conduit 156 connected to the outlet of the pump 109. As is shown in this figure, the sleeve 77a' includes end plate 77c' through which the shafts 80 pass. Oil from conduit 156 passes through openings 77d in the end plates 77c'. Oil, after passing through the interior of the rollers may be returned to the reservoir via an oil return conduct 175.

I have found that the additional length of the cover application station afforded by the belts 160 produces a more uniform and consistent application of solder to the terminal pads. Each belt 160 preferably has a thickness within the range of about 1 to 3 inches and most preferably a thickness of about 2½ inches.

There has thus been described an apparatus for depositing a uniform layer of solder on the terminal pads of printed circuit boards on an assembly line basis. Various modifications will be apparent to those skilled in the art without involving a departure from the spirit and scope of my invention as defined in the appended claims.

What is claimed is:

1. In an apparatus for applying solder to the conductive terminal pads on at least one side of a printed circuit board, the board containing a solder resist layer covering said at least one side except for the areas of the terminal pads, the solder resist layer having a thickness corresponding to the desired height of the solder to be applied and forming cavities extending from the terminal pads to the outer surface of the resist layer, the combination comprising:
   a) means for holding the board in a vertical position and for moving the board along a horizontal axis;
   b) means for directing molten solder against said at least one side of the board while the board is moving along said horizontal axis to fill the cavities with solder;
   c) means for covering the cavities filled with molten solder to retain the solder within the cavities while the board is moving along the axis;
   d) means for cooling the solder within the covered cavities below its solidification temperature; and
   e) means for uncovering the cavities containing solidified solder.

2. The apparatus of claim 1 wherein the molten solder directing means comprises a reservoir of molten solder, nozzle means for directing the solder against the side of the board and pump means connected between the reservoir and the nozzle means for conducting the molten solder under pressure from the reservoir to the nozzle means.

3. The apparatus of claim 2 wherein the solder cooling means includes an oil reservoir, a plurality of oil nozzles positioned along a vertical line for directing oil against said at least one side of the board and the covering means adjacent said at least one side of the board as the board emerges from the covering means.

4. The apparatus of claim 3 further including oil sealing means for contacting the sides of the board and the covering means resilient material to form an oil isolation chamber for inhibiting the migration of oil outside the oil isolation chamber.

5. The apparatus of claim 2 wherein the reservoir is positioned below the circuit board.

6. The apparatus of claim 5 including means for funneling excess solder that does not fill the cavities back into the reservoir.

7. The apparatus of claim 6 wherein the covering means includes a compressible material which is compressed against said at least said one side of the board over a width within the range of about 3 to 12 inches.

8. The apparatus of claim 7 wherein the covering means comprises at least one roller.

9. The apparatus of claim 7 wherein the compressible material of the covering means is compressed against said at least one side of the board with a pressure within the range of about 1 to 3 psi.

10. The apparatus of claim 7 wherein the covering means comprises at least one belt.

11. The apparatus of claim 10 wherein said at least one belt has a thickness within the range of 1 to 2 inches.

12. The apparatus of claim 11 wherein said at least one belt is made of silicon rubber.

13. The apparatus of claim 7 wherein the molten solder directing means further includes heating means for heating the solder in the reservoir to a temperature above its melting point, and wherein the nozzle means comprises a plurality of solder nozzles positioned along a vertical line adjacent said at least one side of the board.

14. The apparatus of claim 13 including solder return means for directing excess solder from the board back into the solder reservoir.

15. The apparatus of claim 14 wherein the solder cooling means includes an oil reservoir, a plurality of oil nozzles positioned along a vertical line adjacent the path of movement of the board for directing oil against said at least one side of the board and the compressible material after the board has emerged from the covering means and an oil pump connected between the oil reservoir and the oil nozzles for pumping the oil from the oil reservoir to the oil nozzles.

16. The apparatus of claim 15 wherein the covering means includes at least one roller having a central opening therein and wherein the solder cooling means further includes means for connecting the oil pump between the oil reservoir and the opening in said at least one roller.

17. The apparatus of claim 16 wherein the covering means comprises a resilient material which is compressed against both sides of the board over a width within the range of about 3 to 12 inches along a vertical zone.

18. The apparatus of claim 17 wherein the covering means includes a pair of rollers positioned on opposite sides of the board as it is moved along the horizontal axis and mounted for rotation along parallel vertically oriented axes and wherein the solder directing means is positioned on one side of the axes of the rollers toward the front of the apparatus.

19. The apparatus of claim 18 further including solder sealing means for contacting the sides of the board and the resilient material of the covering means to form a solder isolation chamber and inhibit the migration of solder outside of the solder isolation chamber.

20. In an apparatus for applying solder to the conductive terminal pads on at least one side of a printed circuit board, the board containing a solder resist layer covering said at least one side except for the areas of the terminal pads, the solder resist layer having a thickness corresponding to the desired height of the solder to be applied and forming cavities extending from the terminal pads to the outer surface of the resist layer, the combination comprising:
   a) means for positioning the board in a predetermined plane and for moving the board in that plane along a predetermined axis;
   b) means for directing molten solder against said at least one side of the board while the board is moving along said predetermined axis to fill the cavities with solder;
   c) means for covering the cavities filled with molten solder to retain the solder within the cavities while the board is moving along the axis;
   d) means for cooling the solder within the covered cavities below its solidification temperature; and
   e) means for uncovering the cavities containing solidified solder.

21. The apparatus of claim 20 wherein the molten solder directing means comprises a reservoir of molten solder, nozzle means for directing the solder against the side of the board and pump means connected between the reservoir and the nozzle means for conducting the molten solder under pressure from the reservoir to the nozzle means.

22. The apparatus of claim 21 wherein the reservoir is positioned below the circuit board.

23. The apparatus of claim 22 including means for funneling excess solder that does not fill the cavities back into the reservoir.

24. The apparatus of claim 23 wherein the covering means includes a compressible material which is compressed against said at least one side of the board over a width within the range of about 3 to 12 inches.

25. The apparatus of claim 24 wherein the covering means comprises at least one roller.

26. The apparatus of claim 24 wherein the compressible material is compressed against said at least one side of the board with a pressure within the range of about 1 to 3 psi.

27. The apparatus of claim 24 wherein the covering means comprises at least one belt.

28. The apparatus of claim 28 wherein said at least one belt has a thickness within the range of 1 to 2 inches.

29. The apparatus of claim 28 wherein said at least one belt is made of silicon rubber.

30. The apparatus of claim 24 wherein the molten solder directing means further includes heating means for heating the solder in the reservoir to a temperature above its melting point, and wherein the nozzle means comprises a plurality of solder nozzles positioned along a line perpendicular to said predetermined axis and adjacent said at least one side of the board.

31. The apparatus of claim 30 including solder return means for directing excess solder from the board back into the solder reservoir.

32. The apparatus of claim 31 wherein the solder cooling means includes an oil reservoir, a plurality of nozzles positioned along a line perpendicular to said predetermined axis and adjacent the path of movement of the board for directing oil against said at least one side of the board and the compressible material after the board has emerged from the covering means and an oil pump connected between the oil reservoir and the nozzles for pumping the oil from the oil reservoir to the oil nozzles.

33. The apparatus of claim 32 wherein the covering means includes at least one roller having a central opening therein and wherein the solder cooling means further includes means for connecting the oil pump between the oil reservoir and the opening in said at least one roller.

34. The apparatus of claim 33 wherein the covering means comprises a resilient material which is compressed against both sides of the board over a width within the range of about 3 to 12 inches along a vertical zone.

35. The apparatus of claim 34 wherein the covering means includes a pair of rollers positioned on opposite sides of the board as it is moved along the predetermined axis and mounted for rotation along axes aligned parallel to the plane of the board and wherein solder directing means is positioned on one side of the axes of the rollers toward the front of the apparatus.

36. The apparatus of claim 35 further including solder sealing means for contacting the sides of the board and the resilient material of the covering means to form a solder isolation chamber and inhibit the migration of solder outside of the solder isolation chamber.

37. The apparatus of claim 36 wherein said predetermined plane is vertical and wherein said predetermined axis is horizontal.

38. The apparatus of claim 36 wherein the solder cooling means includes an oil reservoir, a plurality of oil nozzles positioned along a vertical line for directing oil against the sides of the board and the resilient material adjacent the sides of the board as the board emerges from the covering means.

39. The apparatus of claim 38 further including oil sealing means for contacting the sides of the board and the covering means resilient material to form an oil isolation chamber for inhibiting the migration of oil outside the oil isolation chamber.

40. An apparatus for applying solder simultaneously to conductive terminal pads on two sides of a printed circuit board, the board containing a solder resist layer having a thickness corresponding to the desired height of the solder to be applied and forming cavities extending from the terminal pads to the outer surface of the resist layer comprising:

a) a reservoir of molten solder;

b) means for positioning the board in a predetermined plane above the solder reservoir and for moving the board in said plane along a horizontal axis;

c) means for directing molten solder from said solder reservoir against each side of the board while the board is moving along said horizontal axis to fill the cavities with molten solder;

d) means for covering the cavities filled with molten solder to retain the solder within the cavities while the board is moving along said axis;

e) means for cooling the solder within the cavities below its solidification temperature while the board is moving along said axis; and f) means for uncovering the cavities containing the solidified solder.

41. The apparatus of claim 40 wherein said predetermined plane is substantially vertical.

42. The apparatus of claim 41 wherein the covering means is compressed against each side of the board with a pressure within the range of about 1 to 3 psi.

43. The apparatus of claim 41 wherein the covering means includes a compressible material which is compressed against each side of the board over a width within the range of about 3 to 12 inches.

44. The apparatus of claim 43 wherein the covering means comprises at least two belts.

45. The apparatus of claim 41 wherein the molten solder directing means includes a plurality of solder nozzles positioned along a vertical line adjacent each side of the board and a pump for pumping the molten solder from the solder reservoir to the solder nozzles.

46. The apparatus of claim 45 including solder return means for directing excess solder from the board back into the solder reservoir.

47. The apparatus of claim 45 wherein the solder cooling means includes an oil reservoir, a plurality of oil nozzles positioned along a vertical line adjacent the path of movement of the board for directing oil against at each side of the board and the compressible material after the board has emerged from the covering means and an oil pump connected between the oil reservoir and the oil nozzles for pumping the oil from the oil reservoir to the oil nozzles.

* * * * *

UNITED STATES PATENT AND TRADEMARK OFFICE
CERTIFICATE OF CORRECTION

PATENT NO. : 5,480,483

DATED : January 2, 1996

INVENTOR(S) : Larry N. Velie

It is certified that error appears in the above-identified patent and that said Letters Patent is hereby corrected as shown below:

Column 9, line 45, delete "said" second occurrence.

Column 11, line 6, "claim 28" should read --claim 27--.

Signed and Sealed this

Second Day of April, 1996

Attest:

BRUCE LEHMAN

Attesting Officer     Commissioner of Patents and Trademarks